United States Patent
Kim et al.

(10) Patent No.: US 9,005,850 B2
(45) Date of Patent: Apr. 14, 2015

(54) MASK FOR EXPOSURE AND METHOD OF FABRICATING SUBSTRATE USING SAID MASK

(75) Inventors: Bong-Yeon Kim, Seoul (KR); Min Kang, Seoul (KR); Jong Kwang Lee, Daejeon (KR); Jin Ho Ju, Seoul (KR)

(73) Assignee: Samsung Display Co., Ltd. (KR)

( * ) Notice: Subject to any disclaimer, the term of this patent is extended or adjusted under 35 U.S.C. 154(b) by 310 days.

(21) Appl. No.: 13/471,080

(22) Filed: May 14, 2012

(65) Prior Publication Data

US 2013/0122403 A1 May 16, 2013

(30) Foreign Application Priority Data

Nov. 16, 2011 (KR) .................. 10-2011-0119567

(51) Int. Cl.
*G03F 1/32* (2012.01)
(52) U.S. Cl.
CPC ........................ *G03F 1/32* (2013.01)
(58) Field of Classification Search
CPC .......................................... G03F 1/32
USPC ...................................... 430/5, 311
See application file for complete search history.

(56) References Cited

U.S. PATENT DOCUMENTS

| 5,391,465 | A | * | 2/1995 | Feely ............................ 430/325 |
| 5,538,816 | A | * | 7/1996 | Hashimoto et al. ............... 430/5 |
| 7,022,436 | B2 | | 4/2006 | Cummings |
| 7,523,438 | B2 | | 4/2009 | Hsu et al. |
| 7,838,173 | B2 | | 11/2010 | Chang et al. |
| 2006/0234136 | A1 | * | 10/2006 | Kim .................................. 430/5 |
| 2010/0255409 | A1 | * | 10/2010 | Kang et al. ........................ 430/5 |

FOREIGN PATENT DOCUMENTS

| JP | 07-181669 A | 7/1995 |
| JP | 2008-004917 A | 1/2008 |
| KR | 1020040090401 A | 10/2004 |
| KR | 1020070075735 A | 7/2007 |
| KR | 1020100109771 A | 10/2010 |

* cited by examiner

*Primary Examiner* — Christopher Young
(74) *Attorney, Agent, or Firm* — Innovation Counsel LLP

(57) ABSTRACT

Provided is a photolithography mask capable of forming fine patterns beyond a critical resolution of an exposer without replacing or changing the exposer. The mask includes an at least partially light absorbing phase shift layer and uses a complex wavelength light source.

19 Claims, 16 Drawing Sheets

FIG.12

| 6um Pitch | | Binary Mask | Transmittance | | | | | | | | | | | | | |
|---|---|---|---|---|---|---|---|---|---|---|---|---|---|---|---|---|
| | | | 2% | 4% | 6% | 8% | 10% | 12% | 14% | 16% | 18% | 20% | 22% | 24% | 26% | 28% | 30% |
| | 0 | 0.91 | 0.83 | 0.78 | 0.74 | 0.70 | 0.67 | 0.64 | 0.61 | 0.58 | 0.56 | 0.53 | 0.51 | 0.48 | 0.46 | 0.44 | 0.42 |
| | 20 | 0.91 | 0.83 | 0.79 | 0.75 | 0.71 | 0.67 | 0.64 | 0.61 | 0.59 | 0.56 | 0.53 | 0.51 | 0.49 | 0.47 | 0.44 | 0.42 |
| | 40 | 0.91 | 0.84 | 0.80 | 0.76 | 0.72 | 0.69 | 0.66 | 0.63 | 0.60 | 0.57 | 0.55 | 0.52 | 0.50 | 0.48 | 0.46 | 0.44 |
| | 60 | 0.91 | 0.85 | 0.81 | 0.78 | 0.74 | 0.71 | 0.68 | 0.65 | 0.62 | 0.59 | 0.57 | 0.54 | 0.52 | 0.50 | 0.48 | 0.45 |
| | 80 | 0.91 | 0.87 | 0.83 | 0.80 | 0.77 | 0.73 | 0.70 | 0.67 | 0.65 | 0.62 | 0.59 | 0.57 | 0.55 | 0.52 | 0.50 | 0.48 |
| | 100 | 0.91 | 0.89 | 0.86 | 0.82 | 0.79 | 0.76 | 0.73 | 0.71 | 0.68 | 0.65 | 0.63 | 0.60 | 0.58 | 0.55 | 0.53 | 0.51 |
| | 120 | 0.91 | 0.90 | 0.88 | 0.85 | 0.82 | 0.79 | 0.77 | 0.74 | 0.71 | 0.69 | 0.66 | 0.63 | 0.61 | 0.59 | 0.57 | 0.55 |
| | 140 | 0.91 | 0.92 | 0.90 | 0.87 | 0.85 | 0.82 | 0.79 | 0.77 | 0.74 | 0.72 | 0.69 | 0.67 | 0.65 | 0.64 | 0.62 | 0.60 |
| | 160 | 0.91 | 0.93 | 0.91 | 0.89 | 0.87 | 0.84 | 0.81 | 0.79 | 0.77 | 0.74 | 0.72 | 0.71 | 0.69 | 0.67 | 0.66 | 0.64 |
| Phase Shift (°) | 180 | 0.91 | 0.93 | 0.92 | 0.89 | 0.87 | 0.85 | 0.82 | 0.80 | 0.77 | 0.75 | 0.74 | 0.72 | 0.70 | 0.69 | 0.67 | 0.66 |

FIG.13

| 5um Pitch | | Binary Mask | \multicolumn{15}{c|}{Transmittance} |
|---|---|---|---|---|---|---|---|---|---|---|---|---|---|---|---|---|
| | | | 2% | 4% | 6% | 8% | 10% | 12% | 14% | 16% | 18% | 20% | 22% | 24% | 26% | 28% | 30% |
| Phase Shift (°) | 0 | 0.87 | 0.76 | 0.70 | 0.66 | 0.62 | 0.59 | 0.56 | 0.53 | 0.50 | 0.48 | 0.46 | 0.44 | 0.41 | 0.40 | 0.38 | 0.36 |
| | 20 | 0.87 | 0.76 | 0.71 | 0.67 | 0.63 | 0.60 | 0.56 | 0.54 | 0.51 | 0.49 | 0.46 | 0.44 | 0.42 | 0.40 | 0.38 | 0.36 |
| | 40 | 0.87 | 0.77 | 0.72 | 0.68 | 0.65 | 0.61 | 0.58 | 0.55 | 0.53 | 0.50 | 0.48 | 0.46 | 0.44 | 0.42 | 0.40 | 0.38 |
| | 60 | 0.87 | 0.79 | 0.75 | 0.71 | 0.68 | 0.64 | 0.61 | 0.59 | 0.56 | 0.53 | 0.51 | 0.49 | 0.47 | 0.45 | 0.43 | 0.41 |
| | 80 | 0.87 | 0.82 | 0.78 | 0.75 | 0.72 | 0.69 | 0.66 | 0.63 | 0.60 | 0.58 | 0.55 | 0.53 | 0.51 | 0.49 | 0.46 | 0.44 |
| | 100 | 0.87 | 0.85 | 0.82 | 0.79 | 0.76 | 0.74 | 0.71 | 0.68 | 0.66 | 0.63 | 0.61 | 0.58 | 0.56 | 0.54 | 0.51 | 0.49 |
| | 120 | 0.87 | 0.88 | 0.86 | 0.84 | 0.81 | 0.79 | 0.77 | 0.74 | 0.72 | 0.69 | 0.67 | 0.64 | 0.62 | 0.59 | 0.57 | 0.55 |
| | 140 | 0.87 | 0.90 | 0.89 | 0.88 | 0.86 | 0.84 | 0.82 | 0.80 | 0.77 | 0.75 | 0.73 | 0.70 | 0.68 | 0.65 | 0.63 | 0.61 |
| | 160 | 0.87 | 0.92 | 0.92 | 0.91 | 0.90 | 0.88 | 0.86 | 0.84 | 0.82 | 0.79 | 0.77 | 0.75 | 0.72 | 0.70 | 0.67 | 0.65 |
| | 180 | 0.87 | 0.92 | 0.93 | 0.92 | 0.91 | 0.89 | 0.87 | 0.85 | 0.83 | 0.81 | 0.79 | 0.76 | 0.74 | 0.71 | 0.69 | 0.67 |

FIG.14

| 4um Pitch | Binary Mask | Transmittance | | | | | | | | | | | | | | |
|---|---|---|---|---|---|---|---|---|---|---|---|---|---|---|---|---|
| | | 2% | 4% | 6% | 8% | 10% | 12% | 14% | 16% | 18% | 20% | 22% | 24% | 26% | 28% | 30% |
| 0 | 0.72 | 0.60 | 0.55 | 0.51 | 0.48 | 0.45 | 0.42 | 0.40 | 0.38 | 0.36 | 0.34 | 0.33 | 0.31 | 0.29 | 0.28 | 0.27 |
| 20 | 0.72 | 0.61 | 0.56 | 0.52 | 0.48 | 0.46 | 0.43 | 0.41 | 0.39 | 0.37 | 0.35 | 0.33 | 0.31 | 0.30 | 0.29 | 0.27 |
| 40 | 0.72 | 0.62 | 0.57 | 0.54 | 0.50 | 0.48 | 0.45 | 0.43 | 0.41 | 0.39 | 0.37 | 0.35 | 0.33 | 0.32 | 0.30 | 0.29 |
| 60 | 0.72 | 0.64 | 0.60 | 0.57 | 0.54 | 0.51 | 0.49 | 0.46 | 0.44 | 0.42 | 0.40 | 0.38 | 0.36 | 0.35 | 0.33 | 0.32 |
| 80 | 0.72 | 0.68 | 0.64 | 0.61 | 0.59 | 0.56 | 0.54 | 0.51 | 0.49 | 0.47 | 0.45 | 0.43 | 0.41 | 0.39 | 0.38 | 0.36 |
| 100 | 0.72 | 0.71 | 0.69 | 0.67 | 0.65 | 0.62 | 0.60 | 0.58 | 0.56 | 0.54 | 0.52 | 0.50 | 0.48 | 0.46 | 0.44 | 0.42 |
| 120 | 0.72 | 0.75 | 0.74 | 0.73 | 0.72 | 0.70 | 0.68 | 0.66 | 0.64 | 0.62 | 0.60 | 0.58 | 0.56 | 0.54 | 0.52 | 0.51 |
| 140 | 0.72 | 0.78 | 0.79 | 0.79 | 0.79 | 0.78 | 0.77 | 0.75 | 0.73 | 0.72 | 0.70 | 0.68 | 0.66 | 0.64 | 0.62 | 0.60 |
| 160 | 0.72 | 0.81 | 0.83 | 0.84 | 0.84 | 0.84 | 0.83 | 0.82 | 0.81 | 0.80 | 0.78 | 0.76 | 0.74 | 0.73 | 0.71 | 0.68 |
| 180 | 0.72 | 0.82 | 0.84 | 0.86 | 0.86 | 0.86 | 0.86 | 0.85 | 0.84 | 0.83 | 0.81 | 0.80 | 0.78 | 0.76 | 0.74 | 0.72 |

Phase Shift (°)

FIG.15

| 3um Pitch | Binary Mask | Transmittance | | | | | | | | | | | | | | |
|---|---|---|---|---|---|---|---|---|---|---|---|---|---|---|---|---|
| | | 2% | 4% | 6% | 8% | 10% | 12% | 14% | 16% | 18% | 20% | 22% | 24% | 26% | 28% | 30% |
| 0 | 0.38 | 0.30 | 0.27 | 0.25 | 0.23 | 0.22 | 0.20 | 0.19 | 0.18 | 0.17 | 0.16 | 0.15 | 0.15 | 0.14 | 0.13 | 0.12 |
| 20 | 0.38 | 0.30 | 0.28 | 0.25 | 0.24 | 0.22 | 0.21 | 0.20 | 0.18 | 0.17 | 0.17 | 0.16 | 0.15 | 0.14 | 0.13 | 0.13 |
| 40 | 0.38 | 0.31 | 0.29 | 0.27 | 0.25 | 0.23 | 0.22 | 0.21 | 0.20 | 0.19 | 0.18 | 0.17 | 0.16 | 0.15 | 0.14 | 0.14 |
| 60 | 0.38 | 0.33 | 0.31 | 0.29 | 0.27 | 0.26 | 0.24 | 0.23 | 0.22 | 0.21 | 0.20 | 0.19 | 0.18 | 0.17 | 0.16 | 0.15 |
| 80 | 0.38 | 0.35 | 0.33 | 0.32 | 0.30 | 0.29 | 0.28 | 0.26 | 0.25 | 0.24 | 0.23 | 0.22 | 0.21 | 0.20 | 0.19 | 0.18 |
| 100 | 0.38 | 0.38 | 0.37 | 0.36 | 0.35 | 0.34 | 0.33 | 0.31 | 0.30 | 0.29 | 0.28 | 0.27 | 0.26 | 0.25 | 0.24 | 0.23 |
| 120 | 0.38 | 0.41 | 0.41 | 0.41 | 0.40 | 0.40 | 0.39 | 0.38 | 0.37 | 0.36 | 0.35 | 0.34 | 0.33 | 0.32 | 0.31 | 0.30 |
| 140 | 0.38 | 0.44 | 0.45 | 0.46 | 0.47 | 0.47 | 0.47 | 0.47 | 0.46 | 0.46 | 0.45 | 0.44 | 0.43 | 0.42 | 0.41 | 0.40 |
| 160 | 0.38 | 0.46 | 0.48 | 0.50 | 0.52 | 0.53 | 0.54 | 0.54 | 0.54 | 0.55 | 0.54 | 0.54 | 0.54 | 0.53 | 0.53 | 0.52 |
| 180 | 0.38 | 0.46 | 0.50 | 0.52 | 0.54 | 0.55 | 0.57 | 0.57 | 0.58 | 0.59 | 0.59 | 0.59 | 0.59 | 0.58 | 0.58 | 0.57 |

Phase Shift (°)

MASK FOR EXPOSURE AND METHOD OF FABRICATING SUBSTRATE USING SAID MASK

CROSS-REFERENCE TO RELATED APPLICATION

This application claims priority to, and the benefit of, Korean Patent Application No. 10-2011-0119567 filed in the Korean Intellectual Property Office on Nov. 16, 2011, the entire contents of which are incorporated herein by reference.

BACKGROUND OF THE INVENTION (a) Field of the Invention

Embodiments of the present invention relate generally to flat panel display fabrication. More specifically, embodiments of the present invention relate to a mask for exposure during a flat panel display fabrication process, and a method of fabricating a substrate using the mask.

(b) Description of the Related Art

Today, flat panel display devices are fabricated in various ways. The flat panel display devices can include various display devices such as a liquid crystal display, an organic light emitting device, an electrophoretic display, an MEMS display device, and a 3D display device.

In each of these devices, there exists a growing demand for forming fine patterns. Unlike the general semiconductor field, the flat panel display field has not seen much demand for fine patterns, or improved fine pattern formation techniques.

However, in the drive for increased resolution of these display devices, pixel sizes have shrunk to below the critical resolution of current exposers, thus spawning a demand for fine pattern formation.

Currently, in order to form a fine pattern beyond the critical resolution of the exposer, an exposer having a high resolution is used. That is, the critical resolution is reduced by changing a light source used in the exposer, or by increasing an NA value of the exposer. Previously, the exposer used for manufacturing the display device used a complex wavelength light source having a plurality of light sources, but this limited resolution. The critical resolution was reduced by using a single light source, of a single wavelength. However, the method requires remodeling of the exposer and introduction of new equipment, which entails significant time and cost. Further, since the change to a single wavelength light source and the increase in the NA value reduce the critical resolution and a depth of focus, non-uniformity defects can occur in a display device field using a large-area substrate.

Another approach has been to form the fine pattern by using a mask. In this case, since the fine pattern is formed beyond the critical resolution of the exposer, many defects occur in the formed fine pattern, such that yield reduction and defect frequency become issues.

The above information disclosed in this Background section is only for enhancement of understanding of the background of the invention and therefore it may contain information that does not form the prior art that is already known to a person of ordinary skill in the art.

SUMMARY OF THE INVENTION

Embodiments of the present invention provide a mask for exposure having the advantages of forming fine patterns beyond a critical resolution of an exposer without replacing the exposer.

An exemplary embodiment of the present invention provides a mask for use with light emitted from an exposer having a complex wavelength light source and directed at a worked target, the mask including: a substrate; and an at least partially light absorbing phase shift layer formed on one side of the substrate, in which the at least partially light absorbing phase shift layer is configured to impart a phase shift of about 110 degrees to about 250 degrees to incident light.

The phase shift layer may include an absorbing phase shift material.

The phase shift material may be molybdenum silicide.

Transmittance of the phase shift layer may be more than about 0% and less than about 30%.

The mask may be further configured to impart a pitch of a pattern formed at the worked target, the pitch being about 2.5 µm to about 6 µm.

When the pitch of a pattern formed at the worked target is about 6 µm and the transmittance of the phase shift layer is about 2%, a phase shift provided by the phase shift layer may be about 140 degrees to about 220 degrees.

When the pitch of a pattern formed at the worked target is about 6 µm and the transmittance of the phase shift layer is about 4%, a phase shift provided by the phase shift layer may be about 180 degrees.

When the pitch of a pattern formed at the worked target is about 5 µm and the transmittance of the phase shift layer is about 2%, a phase shift provided by the phase shift layer may be about 120 degrees to about 240 degrees.

When the pitch of a pattern formed at the worked target is about 5 µm and the transmittance of the phase shift layer is about 4% to about 6%, a phase shift provided by the phase shift layer may be about 140 degrees to about 220 degrees.

When the pitch of a pattern formed at the worked target is about 5 µm and the transmittance of the phase shift layer is about 8% to about 10%, a phase shift provided by the phase shift layer may be about 160 degrees to about 200 degrees.

When the pitch of a pattern formed at the worked target is about 5 µm and the transmittance of the phase shift layer is about 12%, a phase shift provided by the phase shift layer may be about 180 degrees.

When the pitch of a pattern formed at the worked target is about 4 µm and the transmittance of the phase shift layer is about 2% to about 6%, a phase shift provided by the phase shift layer may be about 120 degrees to about 240 degrees.

When the pitch of a pattern formed at the worked target is about 4 µm and the transmittance of the phase shift layer is about 8% to about 16%, a phase shift provided by the phase shift layer may be about 140 degrees to about 220 degrees.

When the pitch of a pattern formed at the worked target is about 4 µm and the transmittance of the phase shift layer is about 18% to about 26%, a phase shift provided by the phase shift layer may be about 160 degrees to about 200 degrees.

When the pitch of a pattern formed at the worked target is about 4 µm and the transmittance of the phase shift layer is about 28%, a phase shift provided by the phase shift layer may be about 180 degrees.

When the pitch of a pattern formed at the worked target is about 3 µm and the transmittance of the phase shift layer is about 2% to about 14%, a phase shift provided by the phase shift layer may be about 120 degrees to about 240 degrees.

When the pitch of a pattern formed at the worked target is about 3 µm and the transmittance of the phase shift layer is about 16% to about 30%, a phase shift provided by the phase shift layer may be about 140 degrees to about 220 degrees.

The complex wavelength light source may be configured to emit light having wavelengths of about 435 nm, about 405 nm, and about 365 nm.

Another exemplary embodiment of the present invention provides a method of manufacturing a substrate using a mask, the method including: positioning a mask between a substrate and an exposer, wherein the substrate includes a photoresist and the exposer includes a complex wavelength light source; directing a light upon the mask so as to transmit a portion of the light through the mask and onto the photoresist of the substrate; and developing the photoresist, in which the mask includes a substrate and an at least partially light absorbing phase shift layer formed on one side of the substrate, in which the light transmitting the phase shift layer has a phase shift of about 110 degrees to about 250 degrees.

The manufacturing method may use a mask for exposure of which a phase shift material is molybdenum silicide.

According to the exemplary embodiments of the present invention, a fine pattern beyond, or formed finer than, a critical resolution of the exposer can be formed without replacing or changing the exposer, thereby making it possible to reduce cost. Further, the resulting defect ratio is also relatively small, thereby making it possible to improve quality of the display device.

As described above, it is possible to form a pattern having a pitch smaller than the critical resolution provided in the exposer by using a characteristic of the phase shift layer of invention photolithography mask. The fine pattern can thus be formed, thereby making it possible to improve an aperture ratio and display quality of the display device. In addition, since only the phase shift layer is formed on the mask, the phase shift layer can be formed on the substrate using conventional equipment and processes, thereby making it possible to manufacture the mask at low cost and with less difficulty.

BRIEF DESCRIPTION OF THE DRAWINGS

FIGS. 12 to 15 are Tables showing intensity contrast I/C to transmittance and a phase shift value of a mask for exposure according to the exemplary embodiment of the present invention.

DETAILED DESCRIPTION OF THE EMBODIMENTS

Figure 1:
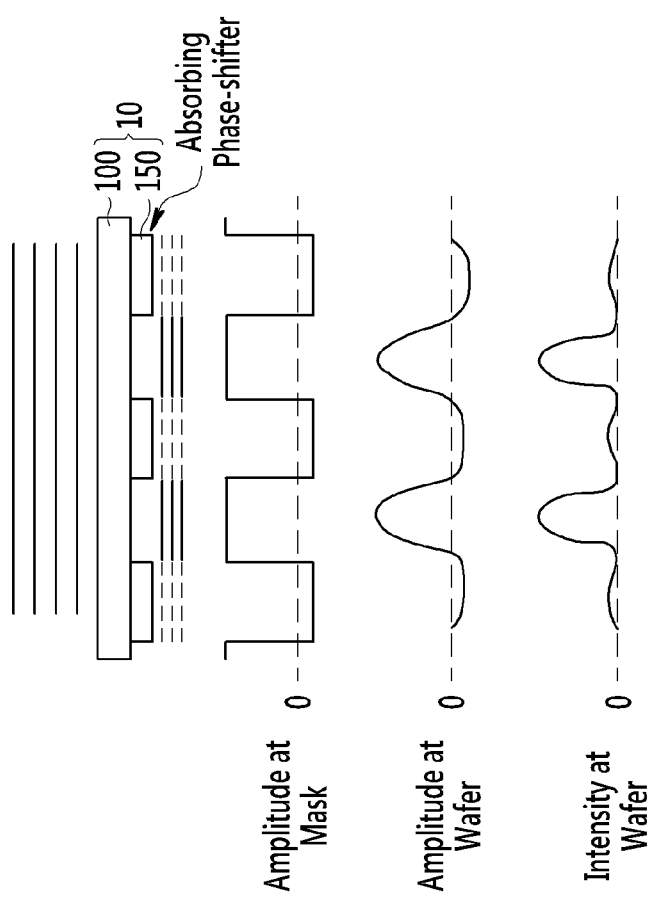
FIG. 1 is a diagram showing a cross-section of a mask for exposure and a characteristic of light transmitting the mask for exposure according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it may be directly on the other element or intervening elements may also be present. In contrast, when an element is referred to as being "directly on" another element, there are no intervening elements present.

Hereinafter, a mask for exposure according to an exemplary embodiment of the present invention will be described in detail with reference to FIG. 1.

FIG. 1 is a diagram showing a cross-section of a mask for exposure, and a characteristic of light transmitted through the mask for exposure, according to an exemplary embodiment of the present invention.

A mask 10 according to the exemplary embodiment of the present invention includes a substrate 100 and a phase shift layer 150 formed at one side of the substrate 100. The substrate 100 according to this exemplary embodiment of the present invention is made of quartz and the phase shift layer 150 is made of a material that can shift the phase of incident light (phase shift material). The phase shift layer 150 according to the exemplary embodiment of the present invention is made of an absorbing phase shift material so that light entering the material of the phase shift layer 150 is phase shifted while light not passing through the actual material of the layer 150 is not phase shifted. Various materials such as molybdenum silicide (MoSi) and the like may be used as the phase shift material of layer 150, and the invention contemplates the use of any material having an absorbing phase shift property.

That is, the light emitted from an exposer (not shown) is inputted to the mask for exposure 10 and the light inputted to a region without the phase shift layer 150 is transmitted as is (i.e., is not phase shifted), but the light inputted to a region with the phase shift layer 150 is transmitted with part of the light phase shifted and the remainder unchanged. That is, that light which passes through the material of the phase shift layer 150 is phase shifted, but that light which passes through gaps in the phase shift layer 150 is not phase shifted.

The light provided from the exposer has a complex wavelength. In this example, the light source has G (435 nm), H (405 nm), and I (365 nm) lines and NA=0.1 or less.

In FIG. 1, a solid line shown above the substrate 100 of the mask for exposure shows light of the complex wavelength emitted from the exposer. In addition, in FIG. 1, a dotted line shown below the phase shift layer 150 represents the light which has been partially lost (absorbed) and partially phase shifted, and a solid line disposed therebetween represents the light which has passed through the substrate 100 but has not been phase shifted.

In short, in FIG. 1, the mask 10 and amplitude and intensity of the light passing through the mask 10 are shown together.

After the light emitted from the exposer passes through the mask 10, a size of the light is shown in Amplitude at Mask of FIG. 1. As shown in FIG. 1, where the phase shift layer 150 is not present, light is essentially transmitted as is, but the light passing through the region with the phase shift layer 150 has a resulting amplitude smaller than 0 after its phase is shifted. That is, FIG. 1 shows that the phase of the light passing through the phase shift layer 150 is changed by 90 degrees or more. In the mask 10 according to the exemplary embodiment of the present invention, the range as to whether the phase shift layer 150 performs any degree of phase shift will be described below through Experimental Example.

Meanwhile, in FIG. 1, the amplitude of light once it reaches a worked target (e.g., a wafer) is shown in Amplitude at Wafer. That is, as shown in FIG. 1, due to a certain amount of interference that occurs between the mask 10 and the worked target, the "square shaped" curve of light distribution at the mask becomes a more rounded and slightly lower-amplitude curve at the worked target.

Meanwhile, Intensity at Wafer of FIG. 1 is the square of the amplitude of light measured at the wafer, and represents intensity of light incident upon the worked target. That is, the light in regions directly below the phase shift layer 150 has a relatively weak intensity based on the center of the phase shift layer 150. As described above, intensity of light in these areas is sufficiently weak as to be negligible, a pattern of the phase shift layer 150 of the mask is transferred to the wafer, thereby forming an appropriate pattern.

In FIG. 1, the region with the phase shift layer 150 and the region without the phase shift layer 150 are periodically repeated and the width of one region of material of the phase shift layer 150 (e.g., one of the rectangular portions of layer 150 shown in FIG. 1) and the width of its adjacent "empty" region (i.e. the adjacent cutout or gap in the phase shift layer 150) is called a pitch. More generally, the sum of the widths of two differing adjacent regions of layer 150 is referred to as a pitch. Further, unless otherwise defined, the widths of two regions in one pitch are the same as each other.

As can be seen in FIG. 1, only when the intensity of light passing through the phase shift layer 150 is negligible, patterns in the mask can be transferred to a photoresist on a worked target. That is, if the intensity of light passing through the phase shift layer 150 is enough to develop the photoresist, patterns in the mask cannot be transferred, since all areas of the photoresist can be developed. In addition, if patterns in the mask are smaller than the maximum resolution of the exposer, patterns on the photoresist, transferred from the mask, are smaller than the maximum resolution of the exposer too.

Embodiments of the invention include any suitable pitch, and any distribution and shape of phase shift layer 150, whether the patterns of its material are repetitive and/or regular, or not. Further, the worked target is described as the wafer, but the worked target may also be a conductive layer and an insulating layer staked on a glass substrate, rather than a wafer.

In addition, as described above, the expression "the intensity of the light passing through the phase shift layer 150 is negligible" is used. The meaning of "negligible" may still vary slightly by factors such as the geometry, thickness, light sensitivity and the like, of the photoresist disposed on the worked target. That is, at least upper portions may be developed in areas on the photoresist corresponding to the phase shift layer 150 and the other portions may remain without developed, though all portions in the other areas on the photo resist corresponding to gaps between the phase shift layers 150 are wholly developed. This may be changed from developed area to non-developed area according to a positive or negative characteristic of the photoresist.

Hereinafter, characteristics of the mask 10 according to the exemplary embodiment of the present invention will be described with reference to graphs of FIGS. 2 to 11.

First, FIG. 2 will be described.

Figure 2:
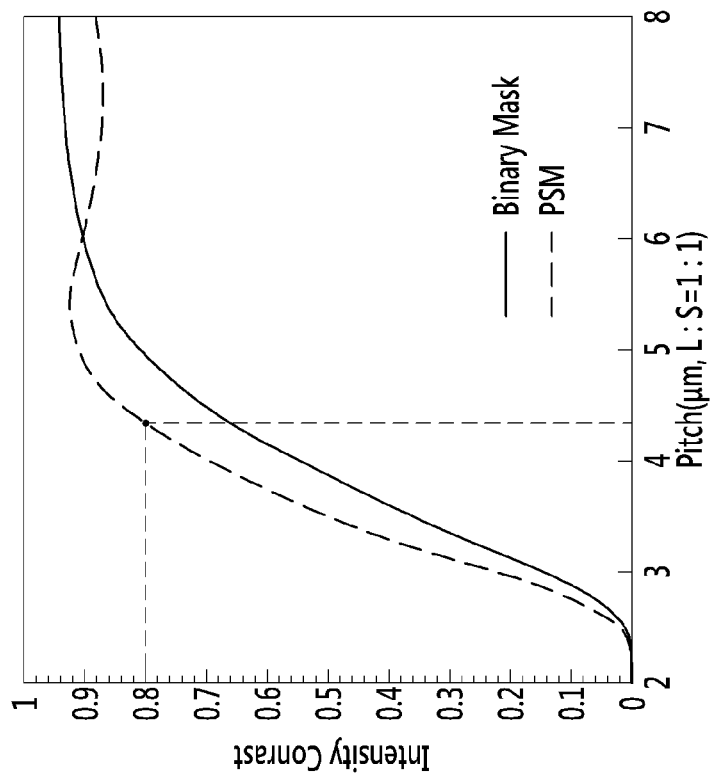
FIG. 2 is a graph showing intensity contrast I/C of light depending on a pitch of a mask for exposure according to the exemplary embodiment of the present invention.

FIG. 2 is a graph showing intensity contrast I/C of light as a function of the pitch of mask 10.

A graph of FIG. 2 is a graph of intensity contrast I/C of light as a function of pitch, and compares the mask 10 (shown as PSM) according to the exemplary embodiment of the present invention with a mask (shown as Binary Mask) in the related art.

First, the mask 10 according to the exemplary embodiment of the present invention is shown as PSM, which is an acronym for phase shift material and is used because the phase shift layer 150 of the mask 10 according to the exemplary embodiment of the present invention uses a phase shift material.

Meanwhile, the mask used in the related art (Binary Mask) does not use a phase shift layer unlike the mask 10, and uses a light blocking material such as chromium to block light. This Binary Mask has a light blocking layer made of chromium disposed on a substrate made of quartz.

Further, the pitches described in FIG. 2 are the sums of widths of the region where the light is irradiated and adjacent regions where the phase-shifted light is irradiated, at the worked target. In addition, in FIG. 2, the widths of two regions forming one pitch are substantially the same (in FIG. 2, shown by L:S=1:1, where L refers to a line and S refers to a space).

Referring to FIG. 2, the Binary Mask in the related art has an intensity contrast I/C value of 0.9 or more when the pitch is 6 μm or more, and has an intensity contrast I/C value of about 0.8 even when the pitch is 5 μm, meaning that the Binary Mask may be used to effectively create patterns having a pitch of as little as 5 μm. The Binary Mask in the related art may also be used to form patterns having a pitch of 5 μm or less. However, since the intensity contrast value in the corresponding region drops rapidly with reduction in pitch, and is lower than the intensity contrast value of the mask 10, it is more preferable to use of the mask 10 of the present invention for forming finer patterns.

The mask 10 according to the exemplary embodiment of the present invention has an intensity contrast value lower than the Binary Mask at pitches of 6 μm or more, but still has an I/C value of 0.8 or more, such that it is still effective for forming the pattern of the corresponding pitch. In addition, the mask 10 according to the exemplary embodiment of the present invention has intensity contrast values that are higher than the Binary Mask for pitches of about 5 μm or less, which is a critical resolution of the exposer. According to the experiment of FIG. 2, a pattern having a pitch of about 4.5 μm may be formed based on an intensity contrast value of 0.8 or more and even in the region having a pitch smaller than 4.5 μm, the mask for exposure 10 has better intensity contrast than the Binary Mask, such that fine patterns may be more readily formed in photoresist. As a result, according to FIG. 2, mask 10 can be effectively used in forming a pattern of more than 2.5 μm and 8 μm or less.

Hereinafter, a degree of phase shift according to a phase shift layer for light of a wavelength used in an exposer will be described with reference to FIG. 3.

Figure 3:
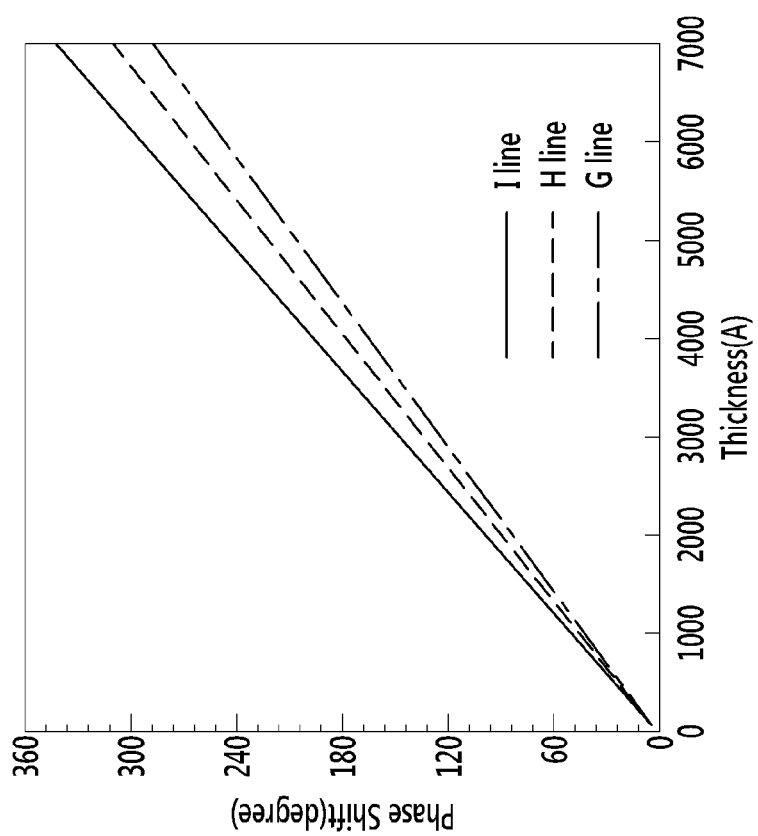
FIG. 3 is a graph showing a phase shift value depending on a thickness of a phase shift layer of a mask for exposure according to the exemplary embodiment of the present invention.

FIG. 3 is a graph showing a phase shift value as a function of thickness of a phase shift layer of a mask according to an exemplary embodiment of the present invention.

FIG. 3 is a graph in which the horizontal axis is a thickness of the phase shift layer 150 (unit is Å) and the vertical axis is a phase shift value provided by the phase shift layer 150.

In FIG. 3, a phase shift value provided for light of each wavelength is shown based on three wavelengths used in the exposer. In FIG. 3, a G line means a wavelength of 435 nm, an H line means a wavelength of 405 nm, and finally, an I line means a wavelength of 365 nm.

The phase shift value imparted to each wavelength linearly increases as a thickness of the phase shift layer 150 increases. Accordingly, when the desired phase shift value to be provided is determined, the corresponding thickness of the phase shift layer 150 of the mask 10 can also be determined.

Hereinafter, a relationship between a phase shift and intensity contrast of the mask 10 according to the exemplary embodiment of the present invention will be described with reference to FIG. 4.

Figure 4:
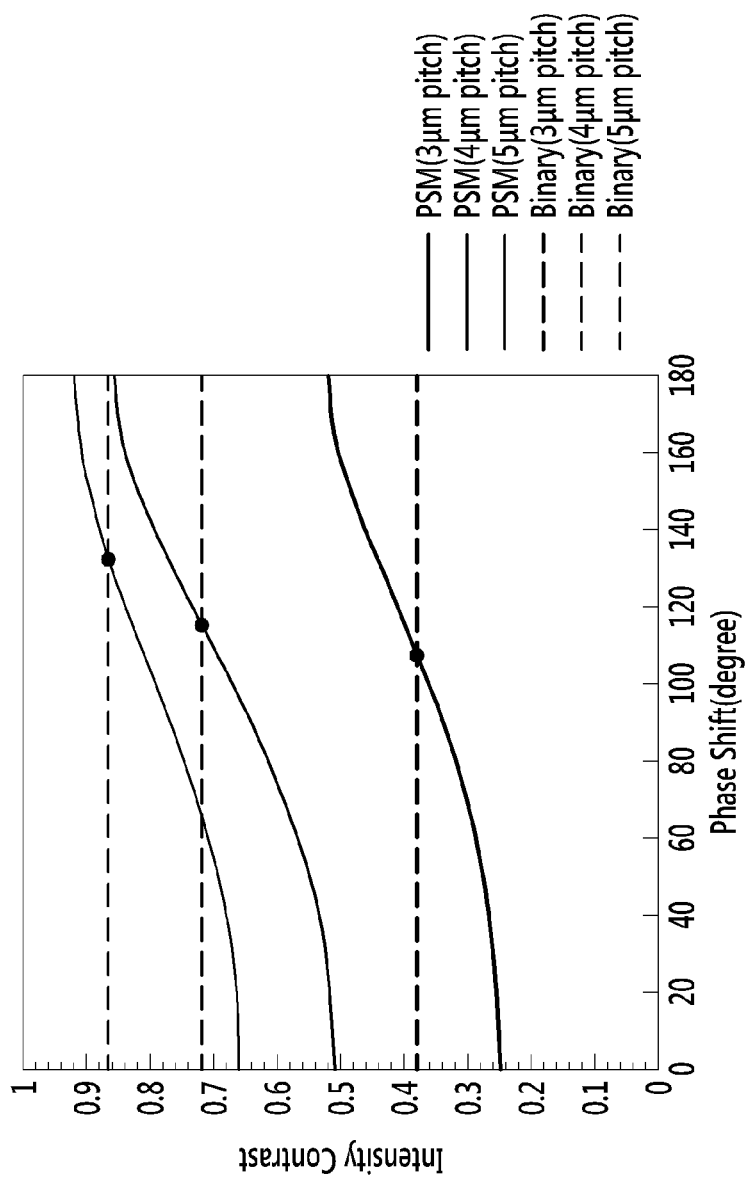
FIG. 4 is a graph showing intensity contrast I/C of light depending on a phase shift value occurring in a phase shift layer of a mask for exposure according to the exemplary embodiment of the present invention.

FIG. 4 is a graph showing intensity contrast I/C of light as a function of a phase shift value occurring in a phase shift layer of a mask according to the exemplary embodiment of the present invention.

In FIG. 4, the horizontal axis represents a phase shift value as an angle unit, and the vertical axis represents an intensity contrast I/C value.

In FIG. 4, the Binary Mask of the related art is also compared with the mask 10 according to the present invention, and both are shown for pitches of 3 µm, 4 µm, and 5 µm of a formed pattern.

First, the 5 µm pitch will be described.

Since the Binary Mask is constant without a phase shift, intensity contrast is constant without change, and has a value of about 0.87. Conversely, the mask 10 according to the exemplary embodiment of the present invention performs a phase shift in the phase shift layer 150 to change the intensity contrast according to the imparted phase shift. When the phase shift value is 0, the light passing through the phase shift layer 150 emerges without phase shift, to be combined with the transmitted light. Constructive interference then occurs, such that the intensity of the light that passes through gaps in the phase shift layer 150 does not decrease. As a result, too much light is present in the areas corresponding to gaps between the phase shift layers 150, and the contrast value has a minimum value.

However, when the phase shift value is 180, the phase of the light passing through the phase shift layer 150 is reversed, so that when it is combined with the transmitted light, destructive interference occurs. As a result, since the intensity in a region on the worked target corresponding to, i.e. directly under, the phase shift layer 150 (hereinafter, referred to as a "region corresponding to a phase shift layer") is reduced, the contrast value has its maximum value.

In between, the intensity contrasts of the masks 10 gradually increase with phase shift (i.e. thickness), so that the PSM masks 10 have higher contrasts than their corresponding Binary Masks at phase shifts ranging from about 130 degrees to 180 degrees.

However, even when the mask 10 has an intensity contrast value lower than the corresponding Binary Mask, the mask 10 may still often be used to form fine patterns. For example, a 5 µm pitch mask 10 can still produce an intensity contrast of about 0.7, which is sufficient to produce fine patterns of 5 µm.

A pitch of 4 µm of FIG. 4 will now be described.

For a pitch of 4 µm, like the previous case, the intensity contrast value has a minimum value when the phase shift does not exist and has a maximum value when the phase shift is 180 degrees. However, as compared with the pitch of 5 µm, the intensity contrast value is reduced overall. In addition, the intensity contrast of the Binary Mask has a value of about 0.72, which is lower than that of a pitch of 5 µm.

The phase shift value region for which mask 10 has intensity contrast higher than the Binary Mask is about 115 degrees to 180 degrees. That is, when forming a fine pattern having the pitch of 4 µm, phase shifts of about 115 degrees to 180 degrees will produce more precisely formed patterns than the Binary Mask. In addition, although the intensity contrast is a little lower than that of the Binary Mask, a fine pattern with a pitch of 4 µm may be formed even in the region having an intensity contrast lower than that of the corresponding Binary Mask. It is difficult to limit the range of the phase shift value which may form the fine pattern of the pitch of 4 µm since there are differences in the phase shift values between embodiments.

Finally, a pitch of 3 µm of FIG. 4 will be described.

For a pitch of 3 µm, as with previous cases, the intensity contrast value has a minimum value when the phase shift does not exist and has a maximum value when the phase shift is 180 degrees. However, as compared with the pitches of 5 µm and 4 µm, the intensity contrast value is reduced overall. In addition, the intensity contrast of the Binary Mask has a value of about 0.38, which is lower than that of the pitches of 5 µm and 4 µm.

The intensity contrast of mask 10 is higher than the Binary Mask for phase shift values of about 110 degrees to 180 degrees. That is, a fine pattern having a pitch of 3 µm is more precisely formed by the mask 10 for phase shift values of about 110 degrees to 180 degrees. For a pitch of 3 µm, it is not preferred to use the mask 10 where the corresponding Binary Mask produces higher intensity contrast. That is, in order to form the fine pattern using such a mask 10, it is preferred to simply increase the phase shift value rather than providing another additional condition in view of a manufacturing cost and degree of working completion.

In conclusion, it is preferable that the phase shift value provided by the phase shift layer 150 has a value of 110 degrees or more in the mask 10 according to the exemplary embodiment of the present invention. In the exemplary embodiment of FIG. 4, the phase shift value is shown up to 180 degrees, but may extend beyond 180 degrees. In addition, since the phase shift values in both sides based on 180 degrees are symmetric, it is preferable that the phase shift value provided by the phase shift layer 150 may be 110 degrees to 250 degrees in the mask 10 according to the exemplary embodiment of the present invention. Herein, 250 degrees is obtained by adding 70 (180-110) degrees to 180 degrees.

Hereinafter, variation in an intensity contrast value according to transmittance will be described with reference to FIG. 5.

Figure 5:
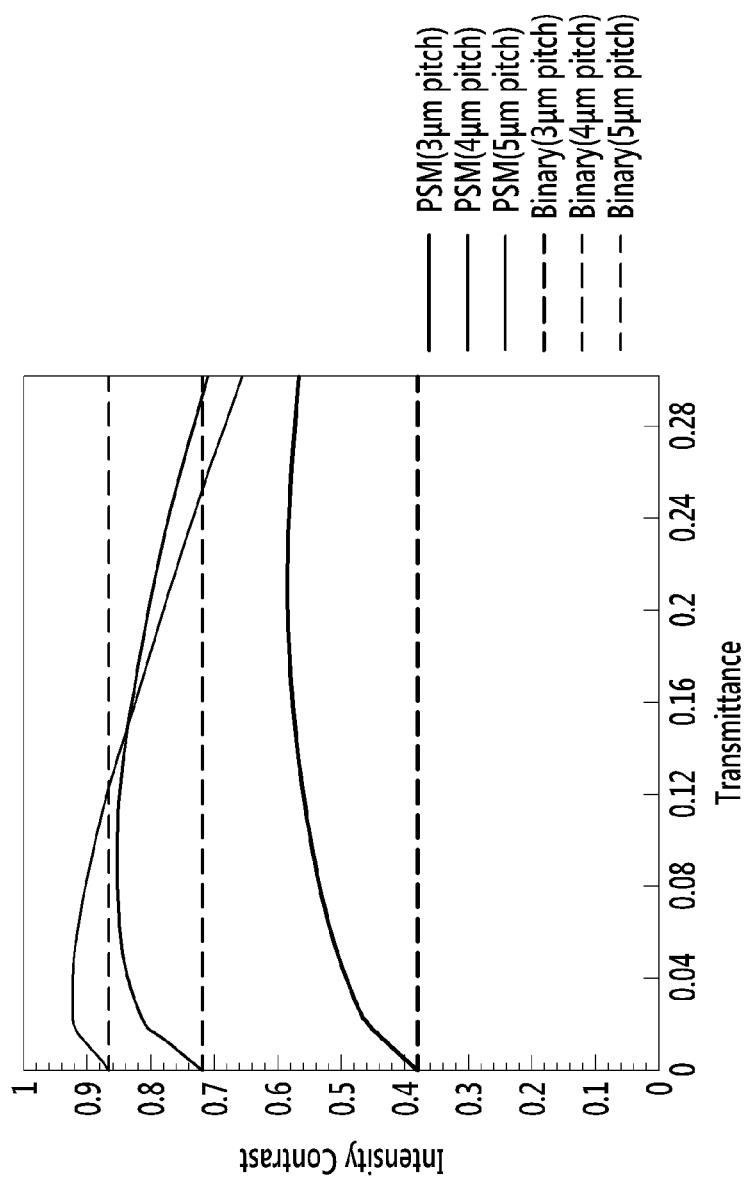
FIG. 5 is a graph showing intensity contrast I/C of light depending on transmittance of light occurring in a phase shift layer of a mask for exposure according to the exemplary embodiment of the present invention.

FIG. 5 is a graph showing intensity contrast I/C of light as a function of transmittance of light in the phase shift layer of a mask according to an exemplary embodiment of the present invention.

In FIG. 5, the horizontal axis represents transmittance in the phase shift layer 150 of 0 to 0.30 (30%), and the vertical axis represents intensity contrast I/C value.

In FIG. 5, the Binary Mask is compared with the mask 10 according to the exemplary embodiment of the present invention, for pitches of 3 µm, 4 µm, and 5 µm. Further, since all the regions corresponding to the phase shift layer 150 are made of chromium, the Binary Mask shown in FIG. 5 is opaque, such that transmittance is 0, but for comparison, the corresponding intensity contrast value is represented by a line. The intensity contrast value of the Binary mask for each pitch shown in FIG. 5 is the same as the value shown in FIG. 4.

First, a pitch of 5 µm is described.

When the transmittance of the phase shift layer 150 is 0, the mask 10 according to the exemplary embodiment of the present invention has the same intensity contrast value as the Binary Mask, and as transmittance increases, the intensity contrast increases to a maximum value. This maximum value occurs at a transmittance of about 0.02 to 0.04, and then continuously decreases. That is, as transmittance increases beyond about 0.02 to 0.04, less light is irradiated upon the region under the phase shift layer, due to destructive interference with diffracted light that does not pass through the phase shift layer 150.

For pitch values of 5 μm, when the transmittance is about 0.13 (13%), the intensity contrast value meets with the intensity contrast value of the Binary Mask, and as transmittance further increases, the intensity contrast continually decreases. The intensity contrast value decreases, but is close to almost 0.7 even up to transmittances of 0.30, such that a fine pattern may be formed up to a transmittance of 0.30 or so.

Now, a pitch of 4 μm is described.

When the transmittance of the phase shift layer 150 is 0, the mask 10 according to the exemplary embodiment of the present invention has the same intensity contrast value as the Binary Mask, and as transmittance increases, the intensity contrast increases to a maximum value at a transmittance of about 0.08 to 0.12, and then gradually decreases. The mask 10 according to the exemplary embodiment of the present invention has the same intensity contrast value as the Binary Mask at a transmittance of about 0.30. Therefore, when a fine pattern having a pitch of 4 μm is desired, the phase shift layer 150 is superior to the Binary Mask up to a transmittance of about 0.30.

Further, in the case of the pitch of 4 μm as compared with the pitch of 5 μm, even though the transmittance in the phase shift layer 150 increases, the intensity contrast value decreases more slowly.

Finally, a pitch of 3 μm is described.

When the transmittance of the phase shift layer 150 is 0, the mask 10 according to the exemplary embodiment of the present invention has the same intensity contrast value as the Binary Mask, and as transmittance increases, the intensity contrast increases to a maximum value at a transmittance of about 0.2, and then slowly decreases. The mask 10 according to the exemplary embodiment of the present invention has an intensity contrast value much larger than the Binary Mask even at a transmittance of 0.30. Therefore, when a fine pattern having a pitch of 3 μm is desired, even a phase shift layer 150 having a transmittance of 30% or more is superior to a Binary Mask.

Further, in the case of the pitch of 3 μm as compared with the pitches of 5 μm and 4 μm, even though the transmittance in the phase shift layer 150 increases, the intensity contrast value decreases much more slowly.

Referring to FIG. 5, until the transmittance of the phase shift layer 150 is 30% (more than 0 and 30% or less), the intensity contrast value is sufficiently high that a fine pattern may be satisfactorily formed. Thus, even when the transmittance is 30% or more, it is expected that a fine pattern may be formed with a pitch of 3 μm. Further, the range may be varied in different embodiments.

As described above, the intensity contrast is shown as a function of the transmittance of the phase shift layer 150 in FIGS. 6 to 11 by combining the results of FIGS. 4 and 5.

FIGS. 6 to 11 are graphs showing intensity contrast I/C of light as a function of a pitch of a mask according to the exemplary embodiment of the present invention.

Figure 6:
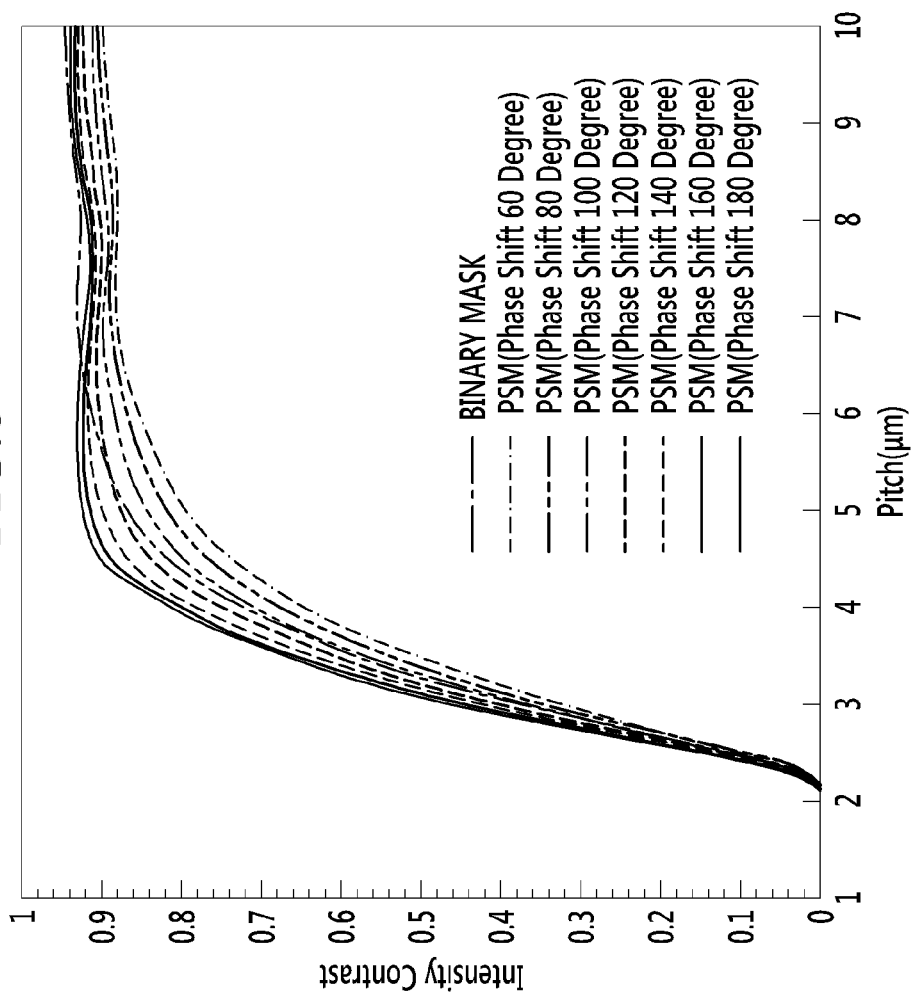
FIGS. 6 to 11 are graphs showing intensity contrast I/C of light depending on a pitch of a mask for exposure according to the exemplary embodiment of the present invention.
Figure 7:
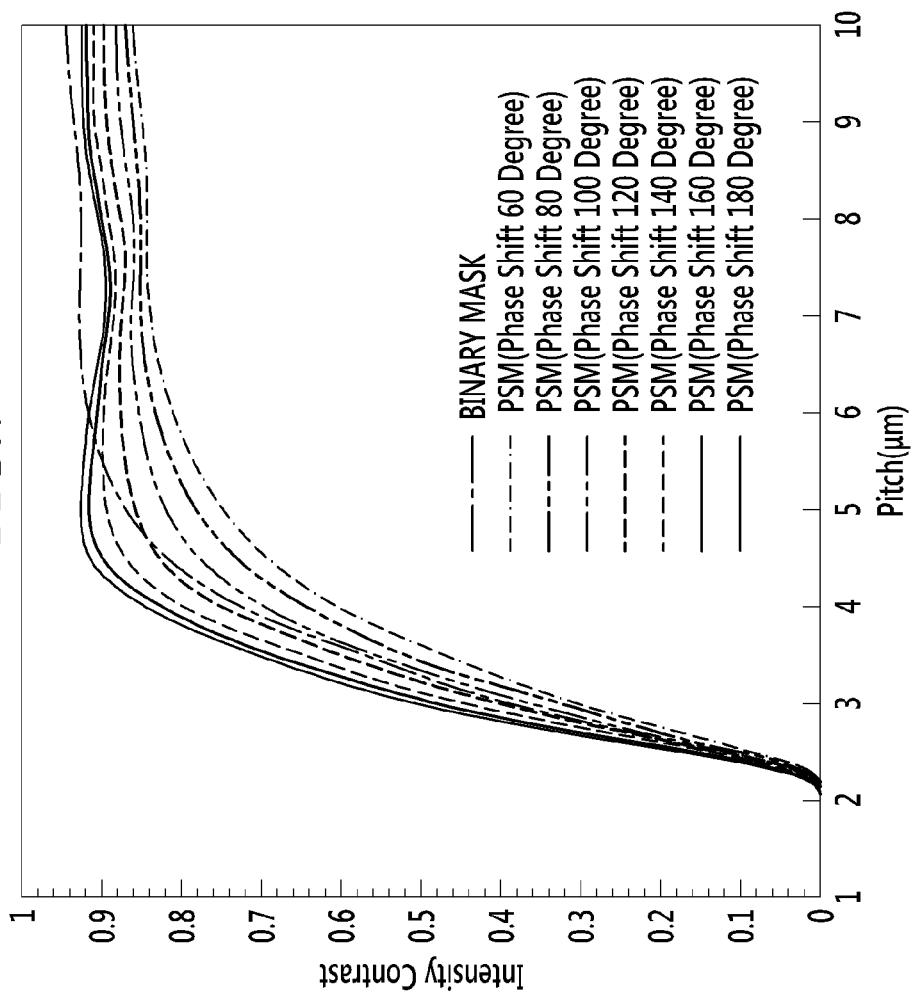
Figure 8:
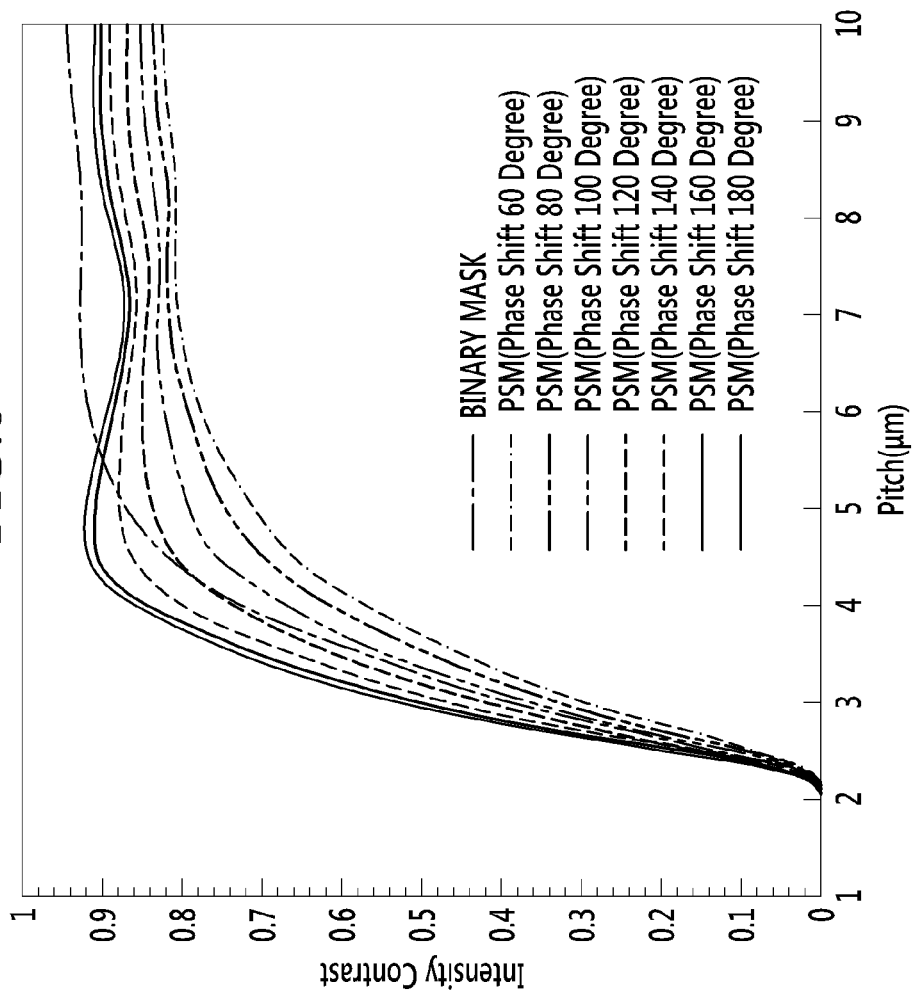
Figure 9:
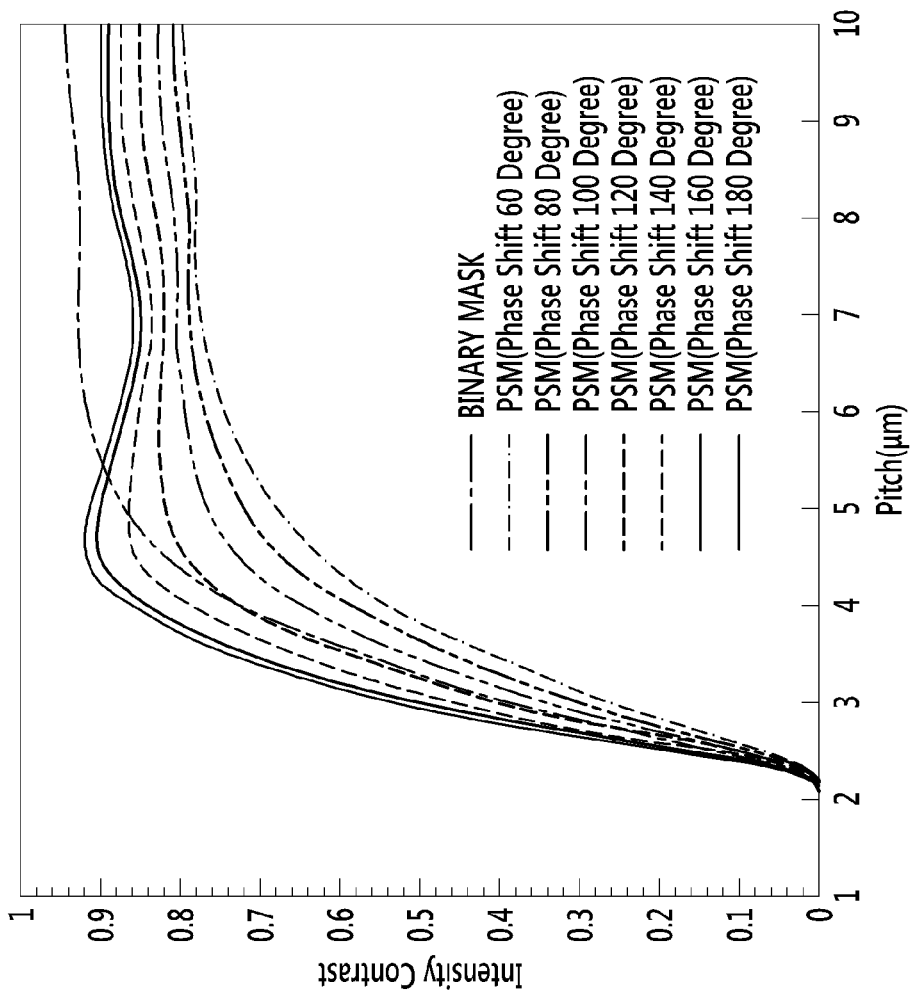
Figure 10:
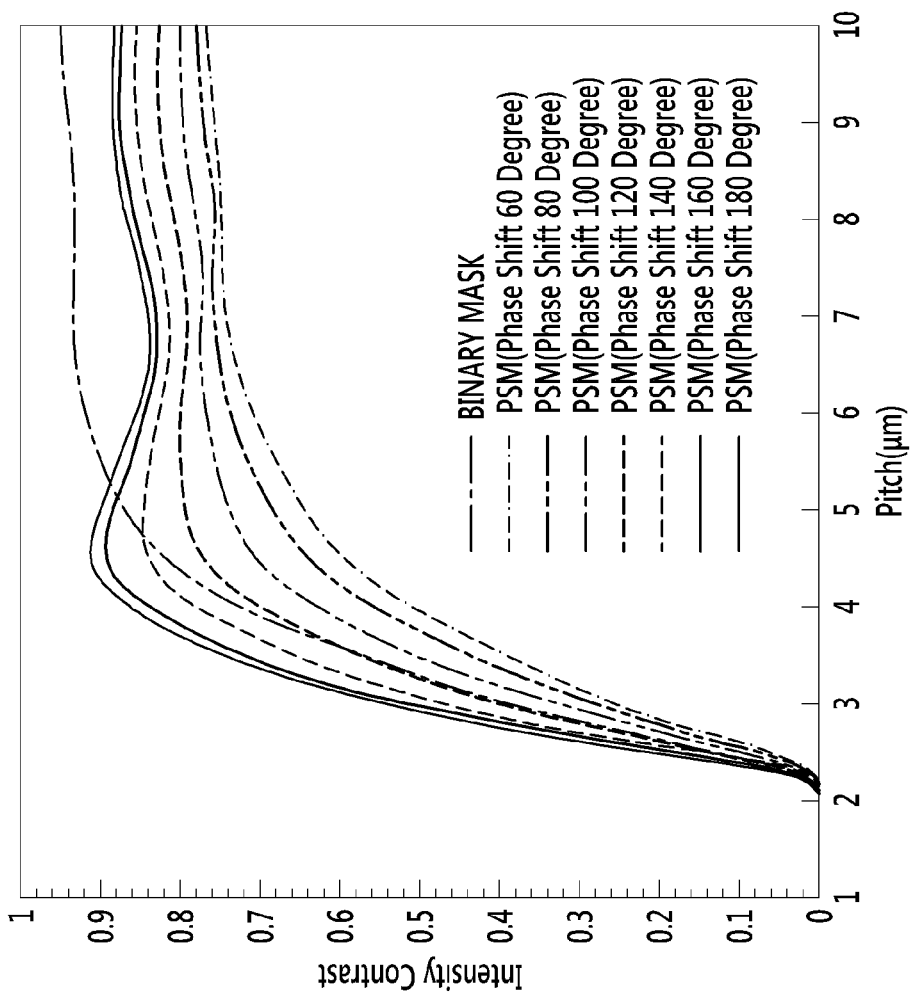
Figure 11:
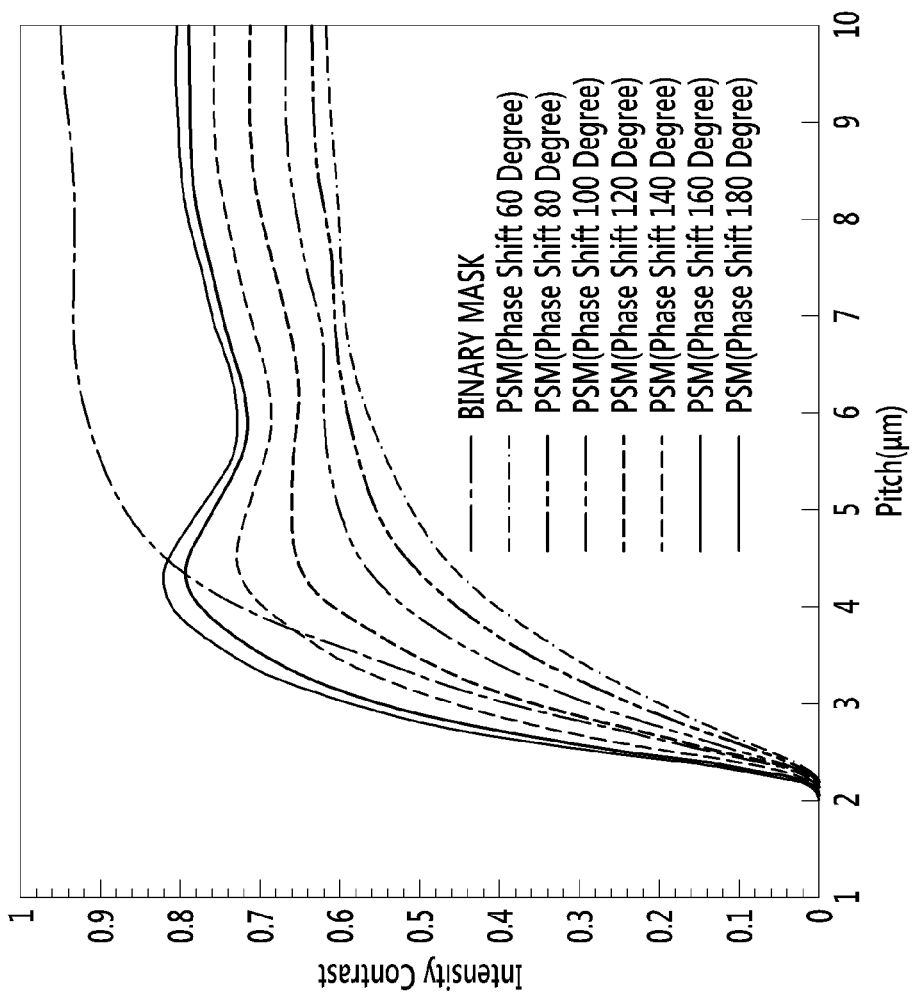

First, FIG. 6 describes a case in which the transmittance of the phase shift layer 150 is 2%. In FIG. 7, the transmittance is 4%, in FIG. 8 it is 6%, in FIG. 9 it is 8%, in FIG. 10 it is 10%, and in FIG. 11 it is 20%.

FIG. 6 will be described below.

In FIG. 6, for pitches of 5 μm or less, when the phase shift value of the phase shift layer 150 is 120 degrees to 180 degrees, the intensity contrast is high as compared with the Binary Mask. When phase shift value is 100 degrees, the intensity contrast value is low as compared with the Binary Mask. Therefore, when the phase shift value is about 110 degrees, it is judged that the intensity contrast value is similar to the intensity contrast for the Binary Mask. Therefore, in order to form a fine pattern of 5 μm or less that is superior to that formed with the Binary Mask, it is preferred that the phase shift value is about 110 degrees or more when the transmittance of the phase shift layer 150 is 2%.

In FIG. 7, when the intensity contrast is higher than the intensity contrast of the Binary Mask for a pitch of 5 μm or less, the phase shift value is 120 degrees or more as shown in FIG. 6. In addition, when the phase shift value is 100 degrees, the intensity contrast is small. Accordingly, it is expected that the intensity contrast will be similar to the intensity contrast of the Binary Mask at a phase shift value of about 110 degrees.

Even in FIGS. 8 to 11, when the intensity contrast is higher than the intensity contrast of the Binary Mask for a pitch of 5 μm or less, the phase shift value is 120 degrees or more as shown in FIG. 6. In addition, when the phase shift value is 100 degrees, the intensity contrast is small. Accordingly, it is expected that the intensity contrast will be similar to the intensity contrast of the Binary Mask at a phase shift value of about 110 degrees. Further, as shown in FIGS. 8 to 11, the case where the intensity contrast is higher than the intensity contrast of the Binary Mask is disposed at an area of the graphs where the pitch is small and where the transmittance in the phase shift layer 150 is small (that is, phase shift degrees of the phase shift layer 150 is large). This shows that it may be more preferred that the phase shift layer 150 transmits a small amount of light.

Meanwhile, hereinafter, the above results are represented by a numerical value based on the corresponding pitch value through Tables.

FIGS. 12 to 15 are Tables showing intensity contrast I/C as a function of transmittance and phase shift value for a mask according to the exemplary embodiment of the present invention.

FIG. 12 shows the case of a pitch of 6 μm, FIG. 13 shows the case of a pitch of 5 μm, FIG. 14 shows the case of a pitch of 4 μm, and FIG. 15 shows the case of a pitch of 3 μm.

In each Table, the first and second rows represent transmittance in the phase shift layer 150, which range from 2% to 30%. Meanwhile, a Binary Mask portion is the Binary Mask of the related art and is for the case where the transmittance is 0%.

Further, in each Table, the first and second columns represent phase shift values provided in the phase shift layer 150, which range from 0 to 180 degrees.

In each Table, numbers written below Binary Mask are intensity contrast values when using the Binary Mask of the related art and since there is no change in phase, constant numerical values are written.

Numbers filled in other cells are intensity contrast values for the case of the corresponding phase shift value and transmittance. Particularly, the cells painted with a double color show for convenience the case where the corresponding intensity contrast value is larger than that of the Binary Mask.

Referring to FIG. 12, the Binary Mask of the related art has an intensity contrast value of 0.91 when a pitch of 6 μm is formed, but the mask 10 according to the embodiment of the present invention for the most part has a value lower than 0.91. However, when the transmittance of the phase shift layer 150 is 2% and the phase shift degree is in the range of 140 degrees to 180 degrees (up to 220 degrees considering the symmetry in 180 degrees or more), the intensity contrast value is higher than that of the Binary Mask and when the transmittance is 4%, the intensity contrast value is higher than that of the Binary Mask at 180 degrees.

Therefore, when the pattern having the pitch of 6 μm is formed, it is also preferred to use the Binary Mask and in the case of the pitch of 6 μm, the mask 10 according to the exemplary embodiment of the present invention also has a sufficiently high intensity contrast value in some cases.

In FIGS. 13 to 15, the mask 10 according to the exemplary embodiment of the present invention has improved intensity contrast as compared with the Binary Mask.

That is, as shown in FIG. 13, in the case where a pitch of 5 µm is formed, when the transmittance of the phase shift layer 150 is 2% and the phase shift degree is in the range of 120 degrees to 180 degrees (240 degrees considering the symmetry in 180 degrees or more), the mask 10 according to the exemplary embodiment of the present invention has an intensity contrast value higher than 0.87, which is the intensity contrast value of the Binary Mask. Further, in the case where the transmittance of the phase shift layer 150 is 4% and 6%, when the phase shift degree is 140 degrees to 180 degrees (220 degrees considering the symmetry in 180 degrees or more), the mask 10 according to the exemplary embodiment of the present invention has an intensity contrast value higher than that of the Binary Mask. In the case where the transmittance of the phase shift layer 150 is 8% and 10%, when the phase shift degree is 160 degrees to 180 degrees (200 degrees considering the symmetry in 180 degrees or more), the mask 10 according to the exemplary embodiment of the present invention has an intensity contrast value higher than that of the Binary Mask. In the case where the transmittance of the phase shift layer 150 is 12%, when the phase shift degree is around 180 degrees, the mask for exposure 10 according to the exemplary embodiment of the present invention has an intensity contrast value higher than that of the Binary Mask.

Accordingly, many conditions exist in which the mask 10 according to the exemplary embodiment of the present invention may produce a fine pattern having a pitch of 5 µm in superior manner to that of the Binary Mask.

Further, as shown in FIG. 14, when a pitch of 4 µm is formed, in a case where the transmittance of the phase shift layer 150 is 2%, 4%, and 6%, when the phase shift degree is 120 degrees to 180 degrees (240 degrees considering the symmetry in 180 degrees or more), the mask 10 according to the exemplary embodiment of the present invention has an intensity contrast value higher than that of 0.72, which is the intensity contrast value of the corresponding Binary Mask. Further, in the case where the transmittance of the phase shift layer 150 is 8%, 10%, 12%, 14%, and 16%, when the phase shift degree is 140 degrees to 180 degrees (220 degrees considering the symmetry in 180 degrees or more), the mask 10 according to the exemplary embodiment of the present invention has an intensity contrast value higher than that of the Binary Mask. In the case where the transmittance of the phase shift layer 150 is 18%, 20%, 22%, 24%, and 26%, when the phase shift degree is 160 degrees to 180 degrees (200 degrees considering the symmetry in 180 degrees or more), the mask 10 according to the exemplary embodiment of the present invention has an intensity contrast value higher than that of the Binary Mask. In the case where the transmittance of the phase shift layer 150 is 28%, when the phase shift degree is around 180 degrees, the mask 10 according to the exemplary embodiment of the present invention has an intensity contrast value higher than that of the Binary Mask.

Accordingly, many conditions exist in which the mask 10 according to the exemplary embodiment of the present invention may produce a fine pattern having a pitch of 4 µm more precisely formed than that of the Binary Mask.

Further, as shown in FIG. 15, when a pitch of 3 µm is formed, in cases where the transmittance of the phase shift layer 150 is 2%, 4%, 6%, 8%, 10%, 12%, and 14%, when the phase shift degree is 120 degrees to 180 degrees (240 degrees considering the symmetry in 180 degrees or more), the mask 10 according to the exemplary embodiment of the present invention has an intensity contrast value higher than 0.38, which is the intensity contrast value of the corresponding Binary Mask. Further, in the cases where the transmittance of the phase shift layer 150 is 16%, 18%, 20%, 22%, 24%, 26%, 28%, and 30%, when the phase shift degree is 140 degrees to 180 degrees (220 degrees considering the symmetry in 180 degrees or more), the mask 10 according to the exemplary embodiment of the present invention has an intensity contrast value higher than that of the Binary Mask.

Accordingly, many conditions exist in which the mask 10 according to the exemplary embodiment of the present invention may produce a fine pattern having a pitch of 3 µm more precisely formed than that of the Binary Mask.

Phase shift angles shown in FIGS. 12 to 15 extend to 180 degrees, but since the phase shift is symmetrical based on 180 degrees, the case of 160 degrees is the same as the case of 200 degrees, the case of 140 degrees is the same as the case of 220 degrees, and the case of 120 degrees is the same as the case of 240 degrees. Further, in FIGS. 12 to 15, since the phase shift angle and the transmittance is changed based on 20 degrees and 2%, respectively, it is expected that the intensity contrast value of the Binary Mask and the intensity contrast value of the mask 10 according to the exemplary embodiment of the present invention will be the same as each other in the middle. That is, in FIG. 13, when the transmittance of the phase shift layer 150 is 2%, the intensity contrast of the mask 10 is 0.88 at 120 degrees and 0.71 at 100 degrees, and thus, it can be seen that 0.87, which is the intensity contrast value of the Binary Mask, will be generated between 100 degrees and 120 degrees. In addition, it is judged that the intensity contrast will be 0.87 for values close to 120 degrees rather than 100 degrees, but considering error and the like, since there is no problem in forming a pattern even for intensity contrast values slightly smaller than those in the related art, it may be judged that 110 degrees is sufficient for generating fine patterns.

As described above, the exposure process can be used to produce more precisely formed fine patterns. In particular, the exposure process can be modified according to embodiments of the invention, to more precisely expose smaller portions of the photoresist, so that development of the photoresist yields finer patterns.

Further, as described above, a pattern having a pitch smaller than a critical resolution provided in the exposer can be formed by using the optical characteristics of the phase shift layer 150 of mask 10. That is, generally, the critical resolution of the exposer using a complex wavelength is known to be about 5 µm, but the mask 10 according to the exemplary embodiment of the present invention can form fine patterns of 2.5 µm to 5 µm. As described above, since a finer pattern can be formed, an aperture ratio and display quality of the display device are improved.

Further, since only the phase shift layer 150 is formed at the mask 10, the phase shift layer 150 can be formed with conventional processes and equipment, thereby allowing for cheaper and easier manufacture.

Hereinafter, a method of manufacturing a substrate for forming a pattern on a worked target by using a mask according to an exemplary embodiment of the present invention will be described with reference to FIG. 16.

Figure 16:
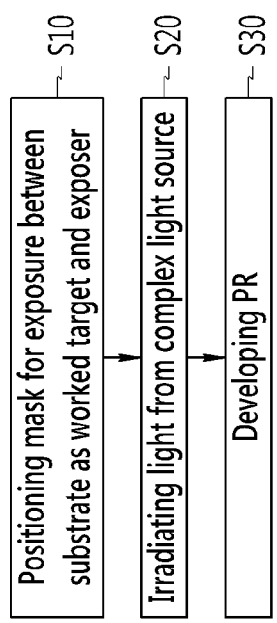
FIG. 16 is a flowchart showing a manufacturing method of a substrate by using a mask for exposure according to the exemplary embodiment of the present invention.

FIG. 16 is a flowchart showing a method of manufacturing a substrate by using a mask according to an exemplary embodiment of the present invention.

In order to form a pattern on a substrate which is a worked target by using a mask according to the exemplary embodiment of the present invention, first, the mask is disposed between the substrate which is a worked target and the exposer (S10).

Herein, a layer having photosensitivity (for example, a photoresist) is formed on the substrate/worked target. Further, an exposer used in the exemplary embodiment of the present invention has a light source with a complex wavelength.

Next, the complex wavelength light source of the exposer is turned on to irradiate the light to the mask. (S20) The light irradiated upon the mask is partially transmitted to the photoreisist on the substrate.

Next, the photoresist is developed to form a pattern imparted by the mask. (S30) Next, a desired pattern is formed, such as through etching.

The mask for exposure includes a phase shift layer like the mask for exposure as described above, and a phase shift value provided by the phase shift layer is 110 degrees to 250 degrees. Further, an absorbing phase shift material can be used as a phase shift material. Any suitable absorbing phase shift material is contemplated. For example, molybdenum silicide can be included as a absorbing phase shift material.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

10: Mask for exposure
100: Substrate
150: Phase shift layer

What is claimed is:

1. A mask for use with light emitted from an exposer having a complex wavelength light source and directed at a worked target, the mask comprising:
   a substrate; and
   an at least partially light absorbing phase shift layer formed on one side of the substrate,
   wherein the at least partially light absorbing phase shift layer is configured to impart a phase shift of about 110 degrees to about 250 degrees to incident light having wavelengths of about 435 nm, about 405 nm, and about 365 nm.

2. The mask for exposure of claim 1, wherein:
   the at least partially light absorbing phase shift layer includes an absorbing phase shift material.

3. The mask for exposure of claim 2, wherein:
   the absorbing phase shift material is molybdenum silicide.

4. The mask for exposure of claim 2, wherein:
   a transmittance of the at least partially light absorbing phase shift layer is more than about 0% and less than about 30%.

5. The mask for exposure of claim 2, wherein:
   the mask is further configured to impart a pitch of a pattern formed at the worked target, the pitch being about 2.5 µm to about 6 µm.

6. The mask for exposure of claim 5, wherein:
   when the pitch of the pattern formed at the worked target is about 6 µm and
   a transmittance of the at least partially light absorbing phase shift layer is about 2%, a phase shift provided by the at least partially light absorbing phase shift layer is from about 140 degrees to about 220 degrees.

7. The mask for exposure of claim 5, wherein:
   when the pitch of the pattern formed at the worked target is about 6 µm and
   a transmittance of the at least partially light absorbing phase shift layer is about 4%, a phase shift provided by the at least partially light absorbing phase shift layer is about 180 degrees.

8. The mask for exposure of claim 5, wherein:
   when the pitch of the pattern formed at the worked target is about 5 µm and
   a transmittance of the at least partially light absorbing phase shift layer is about 2%, a phase shift provided by the at least partially light absorbing phase shift layer is about 120 degrees to about 240 degrees.

9. The mask for exposure of claim 5, wherein:
   when the pitch of the pattern formed at the worked target is about 5 µm and
   a transmittance of the at least partially light absorbing phase shift layer is about 4% to about 6%, a phase shift provided by the at least partially light absorbing phase shift layer is about 140 degrees to about 220 degrees.

10. The mask for exposure of claim 5, wherein:
    when the pitch of the pattern formed at the worked target is about 5 µm and
    a transmittance of the at least partially light absorbing phase shift layer is about 8% to about 10%, a phase shift provided by the at least partially light absorbing phase shift layer is about 160 degrees to about 200 degrees.

11. The mask for exposure of claim 5, wherein:
    when the pitch of the pattern formed at the worked target is about 5 µm and
    a transmittance of the at least partially light absorbing phase shift layer is about 12%, a phase shift provided by the at least partially light absorbing phase shift layer is about 180 degrees.

12. The mask for exposure of claim 5, wherein:
    when the pitch of the pattern formed at the worked target is about 4 µm and
    a transmittance of the at least partially light absorbing phase shift layer is about 2% to about 6%, a phase shift provided by the at least partially light absorbing phase shift layer is about 120 degrees to about 240 degrees.

13. The mask for exposure of claim 5, wherein:
    when the pitch of the pattern formed at the worked target is about 4 µm and
    a transmittance of the at least partially light absorbing phase shift layer is about 8% to about 16%, a phase shift provided by the at least partially light absorbing phase shift layer is about 140 degrees to about 220 degrees.

14. The mask for exposure of claim 5, wherein:
    when the pitch of the pattern formed at the worked target is about 4 µm and
    a transmittance of the at least partially light absorbing phase shift layer is about 18% to about 26%, a phase shift provided by the at least partially light absorbing phase shift layer is about 160 degrees to about 200 degrees.

15. The mask for exposure of claim 5, wherein:
    when the pitch of the pattern formed at the worked target is about 4 µm and
    a transmittance of the at least partially light absorbing phase shift layer is about 28%, a phase shift provided by the at least partially light absorbing phase shift layer is about 180 degrees.

16. The mask for exposure of claim 5, wherein:
    when the pitch of the pattern formed at the worked target is about 3 µm and a transmittance of the at least partially light absorbing phase shift layer is about 2% to about 14%, a phase shift provided by the at least partially light absorbing phase shift layer is about 120 degrees to about 240 degrees.

17. The mask for exposure of claim 5, wherein:

when the pitch of the pattern formed at the worked target is about 3 μm and a transmittance of the at least partially light absorbing phase shift layer is about 16% to about 30%, a phase shift provided by the at least partially light absorbing phase shift layer is about 140 degrees to about 220 degrees.

18. A method of manufacturing a substrate using a mask, the method comprising:

positioning a mask between a substrate and an exposer, wherein the substrate includes a photoresist and the exposer includes a complex wavelength light source;

directing a light upon the mask so as to transmit a portion of the light through the mask and onto the photoresist of the substrate; and developing the photoresist, wherein the mask comprises:

a substrate; and an at least partially light absorbing phase shift layer formed on one side of the substrate, wherein the light transmitted through the at least partially light absorbing phase shift layer has wavelengths of about 435 nm, about 405 nm, and about 365 nm and has imparted thereto a phase shift of about 110 degrees to about 250 degrees.

19. The manufacturing method of claim 18, wherein:

the at least partially light absorbing phase shift layer comprises a phase shift material, and the phase shift material is molybdenum silicide.

* * * * *